US006729143B1

(12) United States Patent
Watts et al.

(10) Patent No.: US 6,729,143 B1
(45) Date of Patent: May 4, 2004

(54) THERMO-ELECTRIC COOLER FOR USE IN AN OPTICAL ASSEMBLY

(75) Inventors: James Watts, Chelmsford (GB); Andrew Liu, Epping (GB); Ian Abraham, Bishops Stortford (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/247,173

(22) Filed: Sep. 19, 2002

(51) Int. Cl.$^7$ .................. F25B 21/02; A25D 23/12; H01S 3/04

(52) U.S. Cl. .................. 62/3.2; 62/259.2; 372/36

(58) Field of Search .................. 62/3.2, 3.3, 3.7, 62/259.2; 372/34, 36; 385/111

(56) References Cited

U.S. PATENT DOCUMENTS

| | | | |
|---|---|---|---|
| 4,019,795 A | * 4/1977 | Ringlien | 445/4 |
| 5,867,513 A | * 2/1999 | Sato | 372/32 |
| 6,164,076 A | * 12/2000 | Chu et al. | 62/3.7 |
| 6,226,424 B1 | * 5/2001 | Ball et al. | 385/14 |

FOREIGN PATENT DOCUMENTS

JP 04257805 A * 9/1992 ............ G02B/6/30

* cited by examiner

Primary Examiner—Chen Wen Jiang
(74) Attorney, Agent, or Firm—Barnes & Thornburg LLP

(57) ABSTRACT

Optical assemblies of the type supported on an optical bench and comprising a one or more components such as lasers, lenses, filters, isolators and waveguides, are sensitive to movement variation. One of the causes of movement is temperature tracking. Previously, thermo-electric coolers have been used to maintain the top-surface temperature of an optical bench within a certain range. However, although thermo-electric coolers are operable to maintain optical bench temperature they are themselves still sensitive to temperature tracking and can deform. Because an optical bench is typically supported on the top surface of a thermo-electric cooler this leads to deformation of the optical bench itself and as a result performance of the optical assembly is affected. An improved design of thermo-electric cooler is described where the top surface of the cooler is divided into separate regions, each having a neutral region in which deformation is minimal. A thermally conductive sheet is placed over each of these regions such that only one temperature monitor is required. Optical components are then supported over the thermally conductive sheet in the neutral regions.

17 Claims, 7 Drawing Sheets

After assembly

During working life
(bowing occurs due
to temperature mis-matches)

THERMO-ELECTRIC COOLER FOR USE IN AN OPTICAL ASSEMBLY

FIELD OF THE INVENTION

The present invention relates to a thermo-electric cooler for use in an optical assembly.

BACKGROUND TO THE INVENTION

Optical assemblies of the type supported on an optical bench and comprising one or more components such as lasers, lenses, filters, isolators and waveguides, are sensitive to movement variation. One of the causes of movement is temperature tracking. The term, "temperature tracking" is used to refer to a temperature dependent variation in the output signal of an optical assembly as a direct result of the movement of components in the optical assembly due to thermal expansion and contraction. This problem is particularly severe for optical assemblies in which the length of the "optical train" is significant; for example, where there are a plurality of optical components positioned in series along the optical bench.

An aim of the present invention is therefore to minimise the impact of temperature tracking for optical assemblies.

Previously, thermo-electric coolers have been used to maintain the top-surface temperature of an optical bench within a certain range. These thermo-electric coolers operate by pumping heat towards or away from the required surface using the Peltier effect. However, although thermo-electric coolers are operable to maintain optical bench temperature they are themselves still sensitive to temperature tracking. In the situation that there is a temperature gradient between the top and bottom surfaces of a thermo-electric cooler the cooler itself begins to deform. Because an optical bench is typically supported on the top surface of a thermo-electric cooler this leads to deformation of the optical bench itself and as a result performance of the optical assembly is affected.

Previously a non-compliant (high tensile modulus) layer has been used on top of the top surface of a thermo-electric cooler. This stiff layer, seated on the thermo-electric cooler acts with brute force resistance to prevent the thermo-electric cooler from bowing, thus minimising the actual magnitude of deformation. However, this method does not actually prevent deformation from occurring it merely works to minimise the resulting effects.

Another object of the present invention is therefore to provide a thermo-electric cooler which overcomes or at least mitigates one or more of the problems mentioned above.

Further benefits and advantages of the invention will become apparent from a consideration of the following detailed description given with reference to the accompanying drawings, which specify and show preferred embodiments of the invention.

SUMMARY OF THE INVENTION

According to an aspect of the present invention there is provided a thermo-electric cooler for use in an optical assembly said thermo-electric cooler comprising:

a surface arranged to provide support for at least part of an optical train in use, said surface being divided into a plurality of regions separated by gaps.

This provides the advantage that each region of the surface has a "neutral region" in which deformation as a result of temperature variation is minimal. By dividing the surface into regions, more of these "neutral regions" are available.

In a preferred embodiment, a thermally conductive layer substantially covers the surface including the gaps. The thermally conductive layer covers the surface and enables heat to be transferred effectively between the regions.

In one embodiment the surface is arranged to indirectly support at least part of the optical train. That is, optical components do not have to be directly supported by the surface of the thermo-electric cooler, although that type of direct support is possible.

Preferably the regions in the surface are of substantially the same size and shape. This provides the advantage that the "neutral regions" of each region of the surface behave in substantially the same manner.

Preferably the thermally conductive layer is also compliant. This is advantageous because the thermally conductive layer is then able to cope with deformation in of the thermo-electric cooler.

Advantageously, the thermo-electric cooler comprises only one temperature monitor.

In one embodiment the thermally conductive layer comprises graphite sheet and has a thermal conductivity greater than about 600 W/mK.

Preferably the thermally conductive layer is arranged to protrude into each of the gaps. This is advantageous because more "slack" is provided in the thermally conductive layer which can be used when substantial deformation of the top surface of the thermo-electric cooler occurs.

The invention also encompasses an optical assembly comprising a thermo-electric cooler as described above.

According to another aspect of the present invention there is provided a method of manufacturing at least part of an optical assembly comprising:

dividing a surface of a thermo-electric cooler into a plurality of regions of substantially the same size and shape; and supporting optical components over the thermally conductive layer.

Preferably the optical components are positioned substantially over neutral regions in said surface. Neutral regions are described in more detail below.

The invention is also directed to a method by which the described apparatus operates and including method steps for carrying out every function of the apparatus.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Embodiments of the present invention are described below by way of example only. These examples represent the best ways of putting the invention into practice that are currently known to the Applicant although they are not the only ways in which this could be achieved.

Figure 1:
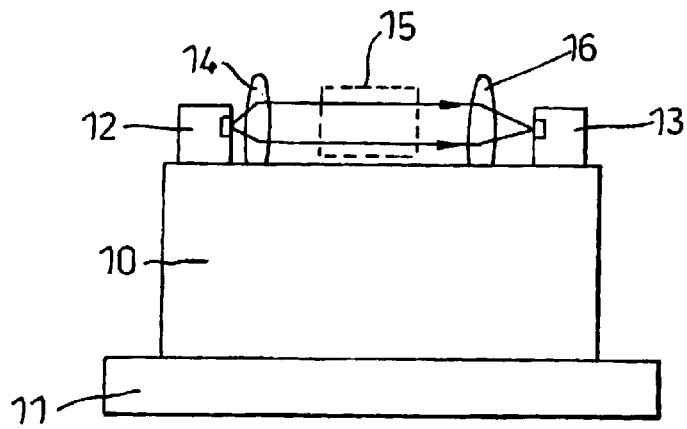
FIG. 1 is a schematic cross-section of an optical assembly according to the prior art comprising a free-space optical train.

FIG. 1 is a schematic cross-section through a free-space optical train according to the prior art. An optical bench comprising a block of silica 10 rests inside a package or case 11. The optical bench supports a free-space optical train comprising a laser 12, two collimating lenses 14, 16, an optical gadget 15 (which may be any suitable device such as a beam splitter or isolator) and a waveguide 13. These components are arranged in series along an upper surface of the optical bench as illustrated in FIG. 1.

An aim for such free-space optical systems is to ensure maximum light or power coupling efficiency between each component in the optical train. Typically, lenses are used to alter the dimensions of the wavefront to accommodate different mode shapes and sizes between adjacent components. FIG. 1 illustrates a simple optical train for clarity; however, if the optical gadget 15 is a modulator or other complex device it may required additional lenses at either side of the device to achieve satisfactory mode-matching and hence coupling.

As mentioned above optical assemblies of this type are sensitive to movement variation which can be caused by temperature changes. This is illustrated in FIG. 2.

Figure 2A:
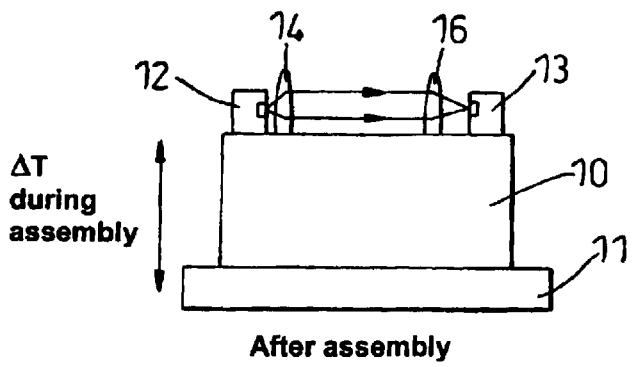
FIG. 2a is a schematic cross-section through an optical assembly before temperature variations have affected the assembly.
Figure 2B:
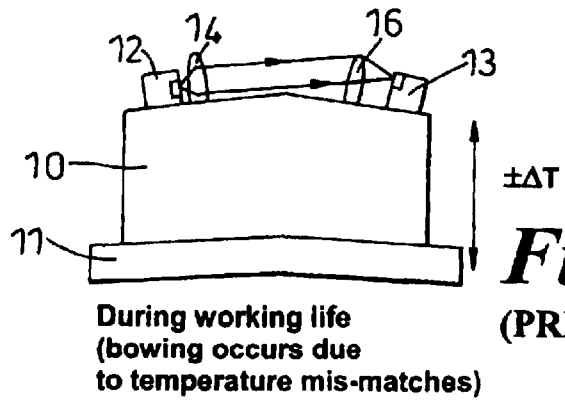
FIG. 2b shows the optical assembly of FIG. 2a after temperature variations have come into play.

FIG. 2a is a schematic cross-section through an optical assembly before temperature variations have affected the assembly. FIG. 2b shows the optical assembly of FIG. 2a after temperature variations have come into play. The same reference numerals as for FIG. 1 are used for the same components.

During manufacture of the optical assembly of FIG. 2a, robotic micro-positioning units place each component to achieve the optimal coupling. FIG. 2a illustrates the light path taken by the laser beam after alignment for a simplified train (the optical gadget 15 is not shown for ease of illustration). Note that there is a temperature difference or gradient, labelled "$\Delta T_{during\ assembly}$" between the laser device 12 (seated on top of the optical bench 10) and the package 11 on the bottom. This temperature gradient can be either positive or negative depending on the (outside) case temperature. Such temperature changes cause thermal expansion or contraction in each of the materials of the assembly and this results in distortion (or bowing) of the optical bench in a similar manner to a bimetallic strip. If the temperature gradient is significantly different from the temperature gradient during manufacture ($\Delta T_{during\ assembly}$) then the light path can be greatly impacted as illustrated in FIG. 2b. This is problematic because optical coupling between the components of the optical chain deteriorates and the optical components themselves can be damaged over time. For particular types of optical component, such as laser devices, the effects of temperature variations are particularly severe. For example, for laser devices, temperatures within ±0.5° C. of a target typically need to be maintained in order to prevent the laser output parameters from shifting out of specification.

Figure 3:
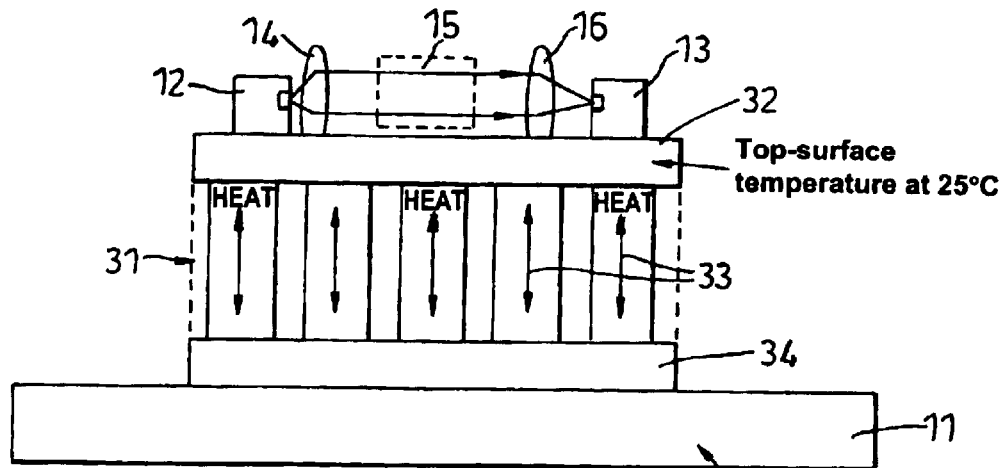
FIG. 3 is a schematic diagram of a thermo-electric cooler according to the prior art and supporting an optical bench.

As mentioned above, thermo-electric coolers have been used to try to control the temperature of an optical bench. FIG. 3 is a schematic diagram of a thermo-electric cooler according to the prior art and supporting an optical bench. The same reference numerals as for FIGS. 1 and 2 are used for corresponding components.

The thermo-electric cooler comprises a plurality of Peltier elements in the form of columns 33 arranged in parallel between a top plate 32 and a bottom plate 34, The Peltier elements 33 are connected to the top plate and bottom plate using solder joints or any other suitable type of joint and this is discussed in more detail below. The Peltier elements are spaced from one another as illustrated such that there are air gaps (shows as white regions in FIG. 3) between the elements 33. The elements 33 themselves act as paired units and have track metalisations daisy-chaining them in series. The thermo-electric cooler also comprises a monitoring system (for example, a small thermistor plus an integrated circuit) which is used to feedback temperature information from the top plate 33 to the thermo-electric cooler itself.

The thermo-electric cooler operates by pumping heat towards or away from the top plate 32 via the columns 33 and using the Peltier effect. The level and direction of heat-pumping is controlled on the basis of feedback from the temperature monitoring system such that the temperature of the top plate 32 is maintained at a pre-specified level. For example, the top plate 32 is maintained at 25° C. whilst the temperature outside the packaging or case can vary between −20° C. and +85° C.

Figure 4A:
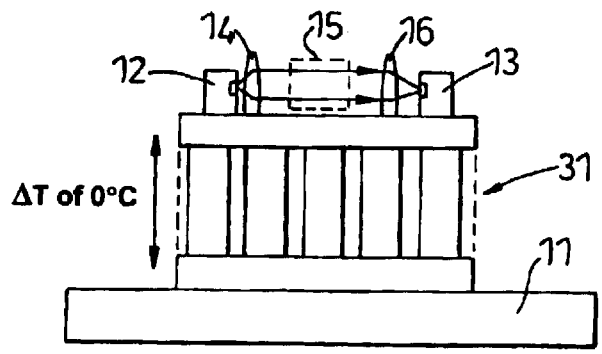
FIG. 4a is a schematic diagram of a thermo-electric cooler supporting an optical assembly and where the temperature gradient experienced by the thermo-electric cooler is minimal.
Figure 4B:
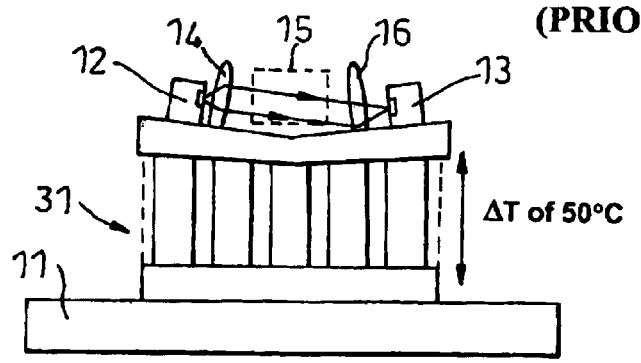
FIG. 4b is a schematic diagram of the thermo-electric cooler of FIG. 4a where the temperature gradient is 50° C.

The present invention recognises that although a thermo-electric cooler is able to maintain an optical bench temperature, the thermo-electric cooler itself is still sensitive to "temperature tracking". With the introduction of a temperature gradient between the top and bottom plates of the thermo-electric cooler the cooler itself begins to deform. FIGS. 4a and 4b illustrate this effect. For example, the vertical displacement at either end of the top plate can be about +1.2 μm for a 20 mm length thermo-electric cooler with a temperature gradient of 50° C.

Figure 5:
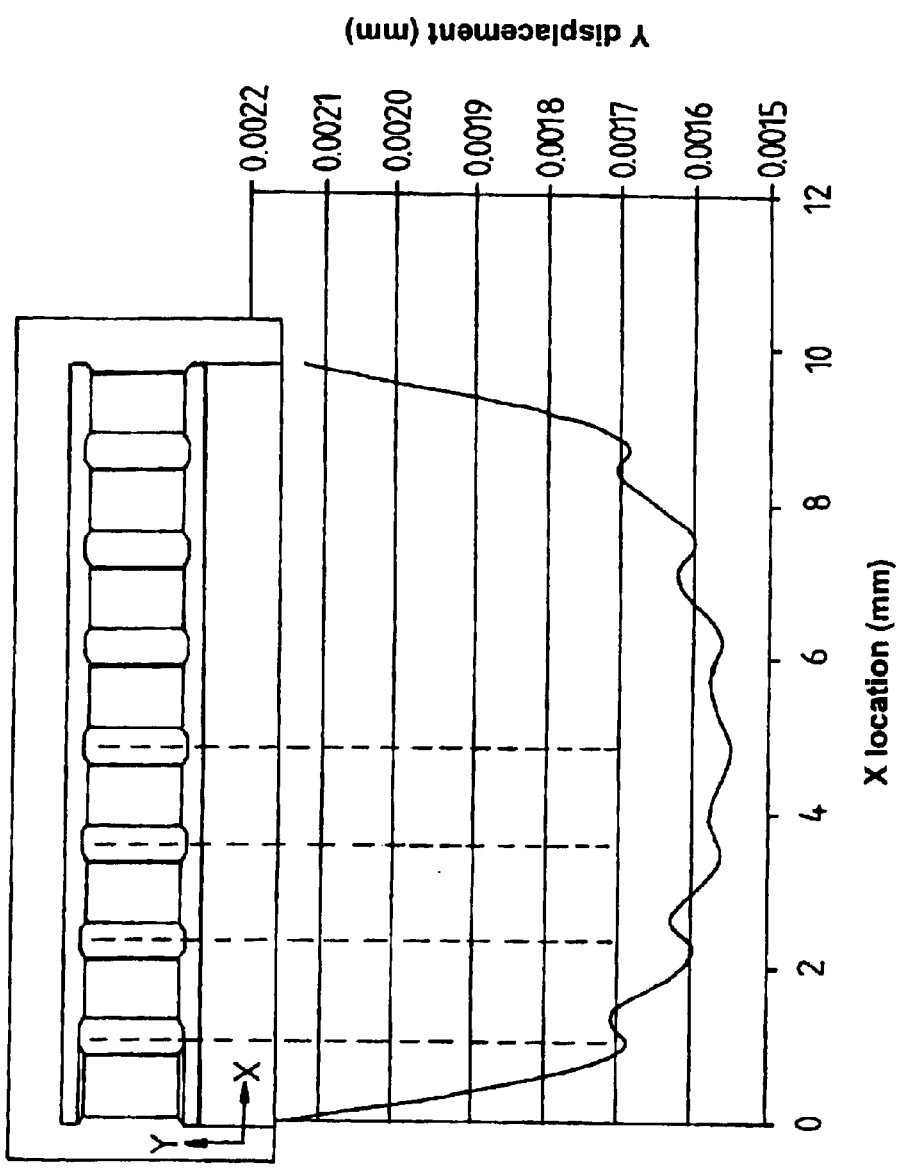
FIG. 5 is a graph of vertical displacement (y displacement) against location (x location) along the longitudinal axis of the top surface of a thermo-electric cooler.

We modelled the effects of a temperature gradient of 50° C. on a thermo-electric cooler mounted on a Kovar baseplate and found a bathtub shape deformation on the upper surface of the thermo-electric cooler. FIG. 5 is a graph of the resulting vertical displacement along the centre line of the longest side of the thermo-electric cooler. This centre line is typically the location along which optical components are positioned. It can be seen that a vertical displacement of over 0.0016 mm is experienced around the centre of the top surface of the thermo-electric cooler and overall a trough or valley formation is found.

Two types of movement caused by deformation of the upper surface of the thermo-electric cooler can adversely affect optical coupling. These are angular tilt and vertical movement off the optic axis. For our purposes the optic axis is a straight line along the optical centre of each component (for instance, starting with a laser, through the centre of all the lenses and optical device and finally to a waveguide). Any component situated off this axis (i.e. as a result of vertical movement) will impact the maximum attainable coupling, due to the undesired introduction of losses such as aberrations. Angular tilt occurs where the angle of the optical bench is no longer coplanar to the optic axis, and is of most concern to thick collimating lenses, whereby any tilt can alter the position of the image. As optical trains become more integrated and more complex, it is likely that the path lengths (from start to finish) will increase, thus emphasising the magnitude of these effects.

As a result of our modelling of the effects of temperature gradients on thermo-electric coolers we observed a "neutral point" on the top surface of the thermo-electric cooler. At and near this neutral point it is possible to guarantee zero tilt. This was found for any temperature range or gradient.

As shown in FIG. 5 we found a surface inflection occurring at a x-location of 5 mm (i.e. in the approximate centre of the thermo-helectric cooler top surface). This type of point is referred to as a "neutral point". We also found that a "neutral region" exists where components can be placed in that region with minimal risk of temperature tracking variation occurring.

Preferably the neutral region provides a region in which components do not experience temperature tracking variations which affect more than 1% of the coupling signal. Consideration of theoretical losses in coupling efficiencies enabled us to determine that this typically requires a neutral region in which vertical displacement is no more than about +/−0.05 $\mu$m.

One problem is obviously that such neutral regions represent a small portion of the available surface area on the top of the thermo-electric cooler. However, the present invention addresses this by dividing the top surface of the thermo-electric cooler into sections each having a neutral region. This increases the total amount of neutral region as a proportion of the top surface area of the thermo-electric cooler.

We recognised that the section of the top surface of the thermo-electric cooler needs to be arranged so that the action of the heat-pump columns 33 as paired units and the electrical wiring of those columns 33 is not affected. It would also be advantageous to arrange the sections in the top surface of the thermo-electric cooler so that the resulting neutral regions act in the same manner. Also, the temperature feedback system of the thermo-electric cooler must still be effective despite dividing the top surface into sections.

Figure 6:
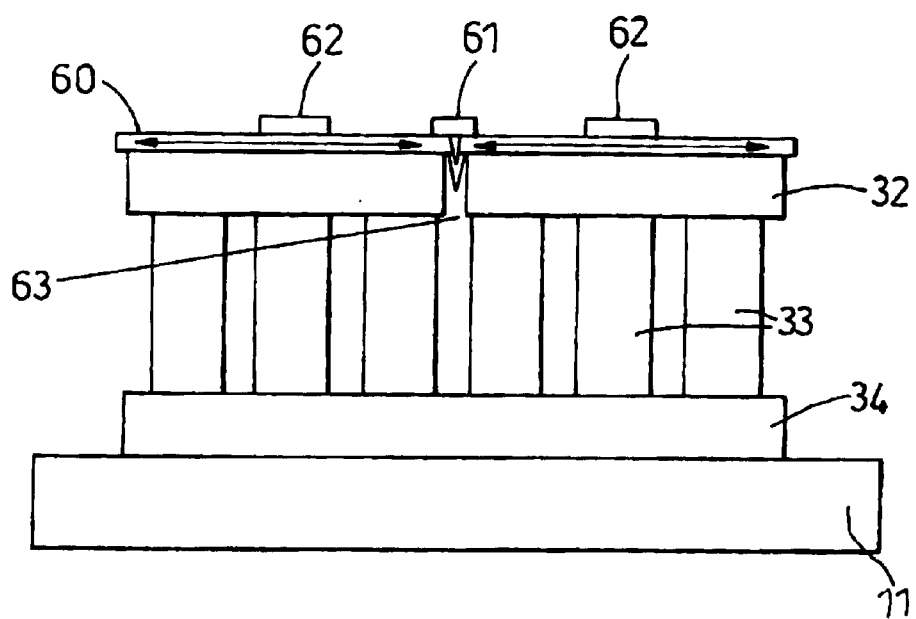
FIG. 6 is a schematic cross-section through a thermo-electric cooler arranged according to the present invention.

FIG. 6 illustrates how these issues are addressed. It shows a cross-section through a thermo-electric cooler according to an embodiment of the invention. The same reference numerals are used as in previous figures where components correspond. The top surface 32 or plate of the thermo-electric cooler is divided into two substantially equal halves such that an air gap 63 exists between those two halves. A neutral region 62 thus exists approximately in the centres of each of these two halves. (In FIG. 6 the neutral regions are shown schematically as rectangular blocks for clarity; in practice these are simply regions on the surface of the thermo-electric cooler.) Because the top surface 32 is divided into two substantially equal halves the neutral regions in each half behave in a similar manner to one another. Also, by splitting only the top surface 32 of the thermo-electric cooler (the bottom surface 34 remains intact) the electrical connections between the columns 33 of the thermo-electric cooler are not affected. Because the neutral regions behave in a similar manner to one another there is minimal relative vertical displacement between them as a result of temperature changes. As mentioned above, angular tilt for these neutral regions is also minimal as a result of temperature variations. This means that by placing optical components over the neutral regions, optical coupling is minimally disrupted by temperature changes.

In a preferred embodiment a thermally conductive film 60 is also provided over the surface of the thermo-electric cooler and extending onto both halves of this surface. This film 60 facilitates the use of only one monitor for the temperature feedback system of the thermo-electric cooler. The thermally conductive film 60 distributes heat efficiently throughout itself such that the top surface of the thermo-electric cooler is substantially at the same temperature across its whole surface area.

It is not essential to use thermally conductive film 60 in this way. It is also possible to place the optical components directly onto the top supporting surface of the thermo-electric cooler. In that case the regions of the thermo-electric cooler surface may differ in temperature from one another but for many applications a workable solutions is achieved in this way using only one temperature monitor for the thermo-electric cooler. Because of the electrical connections between the columns of the thermo-electric cooler it is not practical to use one temperature monitor per region.

In a preferred embodiment the thermally conductive film 60 is flexible or compliant and extends or protrudes into the air gap between the two halves of the top surface as illustrated in FIG. 6. This provides "slack" in the film which can be used to accommodate any significant deformation of the top surface of the thermo-electric cooler.

Also, the thermally conductive film can be made from any suitable material, such as one which has a thermal conductivity of greater than about 600 W/mK. An example is Panasonic Graphite Sheet as currently commercially available from Panasonic (trade mark) with characteristics as given below:

a thickness of about 0.1±0.05 mm;

a density of about 1.0 g/cm$^3$ an electrical conductivity of about 10000 S/cm;

and extensional strength of about 19.6 MPa;

and a heat resistance of about 400° C.

Figure 7:
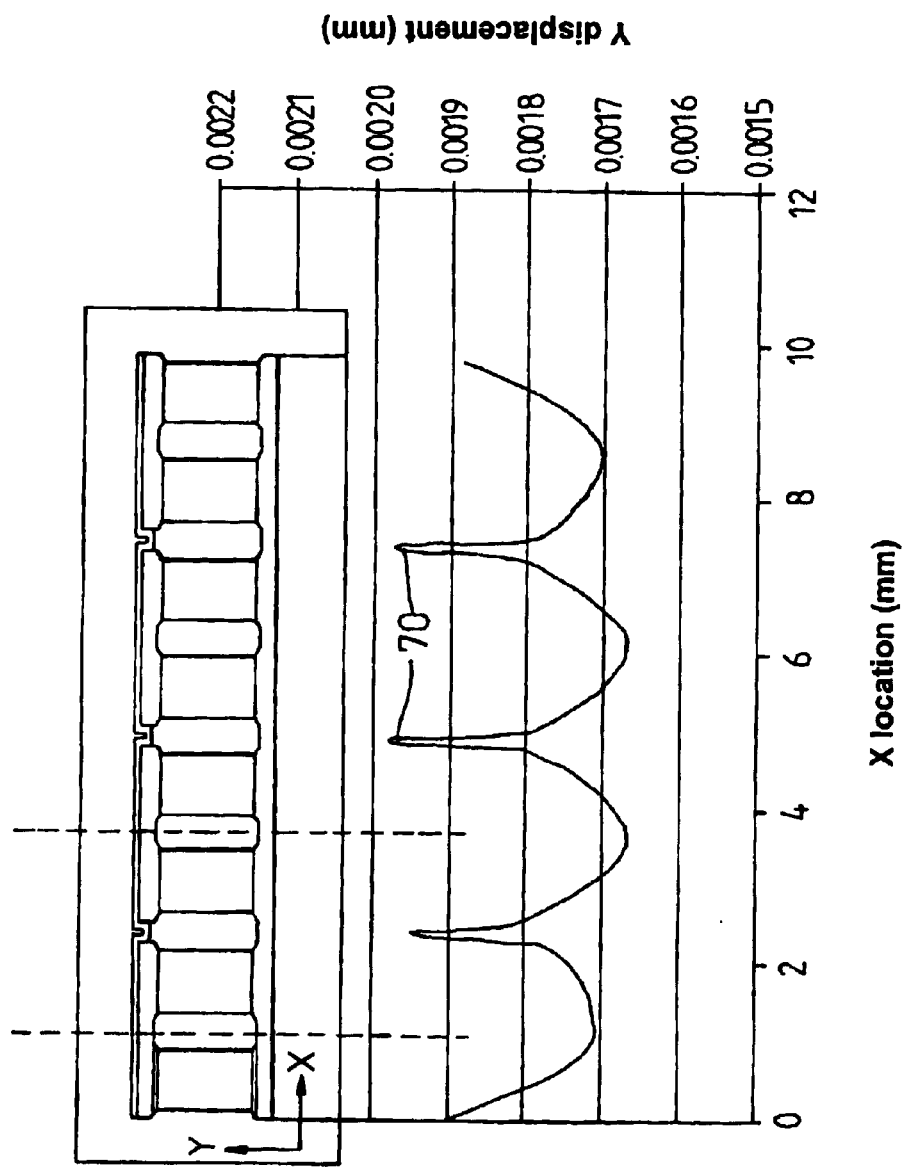
FIG. 7 is a graph of vertical displacement (y displacement) against location (x location) along the longitudinal axis of the top surface of a thermo-electric cooler which has been divided into four sections.

It is not essential to divide the top surface of the thermo-electric cooler into equal halves. That surface can be divided or segmented into any suitable number of regions of substantially the same shape and size. For example, FIG. 7 shows the situation in which 4 regions are created and also gives a graph of the vertical displacement as calculated for a 50° C. temperature gradient between the top and bottom plates of the thermo-electric cooler. It can be seen that four troughs in the vertical displacement graph are present, one for each of the four sections of the top surface of the thermo-electric cooler and giving one neutral region for each of those four sections. This contrasts with the situation in FIG. 5 in which only one neutral region is present. The arrangement of FIG. 5 would provide room to accommodate three optical components of thickness 1.75 mm in the trough along its longitudinal axis whereas the arrangement of FIG. 7 provides room to accommodate four such optical components within the troughs. In the case that large optical components are used which cannot be accommodated in the troughs, these can be arranged to sit on the peaks 70 in FIG. 7. FIG. 6 also illustrates one of these peaks as inflection point 61. For example, the arrangement of FIG. 5 could accommodate one laser carrier sled of length 3.25 mm in this way whilst the arrangement of FIG. 7 could accommodate two such laser carrier sleds. These peaks 70 experience substantially the same amount of vertical displacement as one another as a result of temperature variations. Also they experience minimal angular tilt as a result of temperature variations. As such they are a type of "neutral regions".

Figure 8:
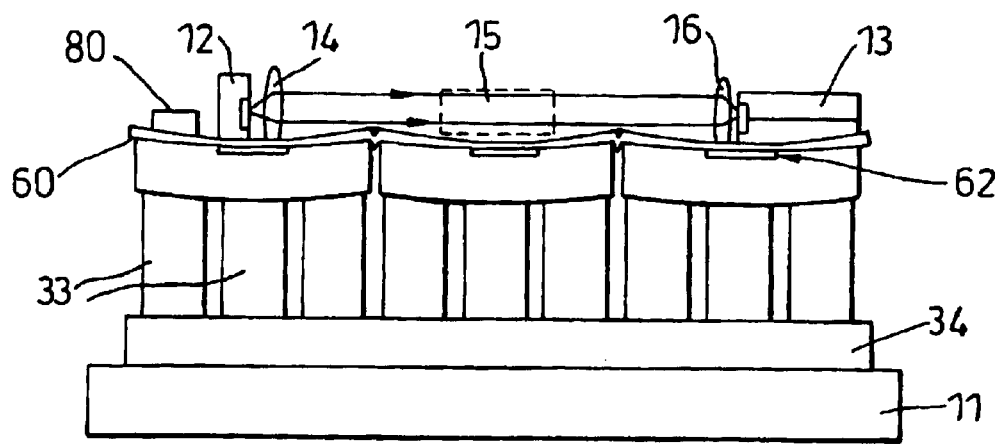
FIG. 8 is a schematic diagram of a thermo-electric cooler according to an embodiment of the present invention showing how that thermo-electric cooler can be used to support an optical assembly.

FIG. 8 is a schematic diagram of a thermo-electric cooler according to an embodiment of the present invention showing how that thermo-electric cooler can be used to support an optical assembly such that each of the optical components in the assembly is located on a neutral region.

The top surface of the thermo-electric cooler is split into three substantially equal parts as illustrated and a thermally conductive film 60 substantially covers the top surface of those three parts. Only one thermistor 80 is provided as part of the temperature feedback mechanism for the thermo-electric cooler. A neutral region 62 is present approximately at and around the centre of the top surface of each of the three regions. These neutral regions are used to support components of an optical train where those components are indicated by the same reference numerals as used in FIG. 1.

Figure 9:
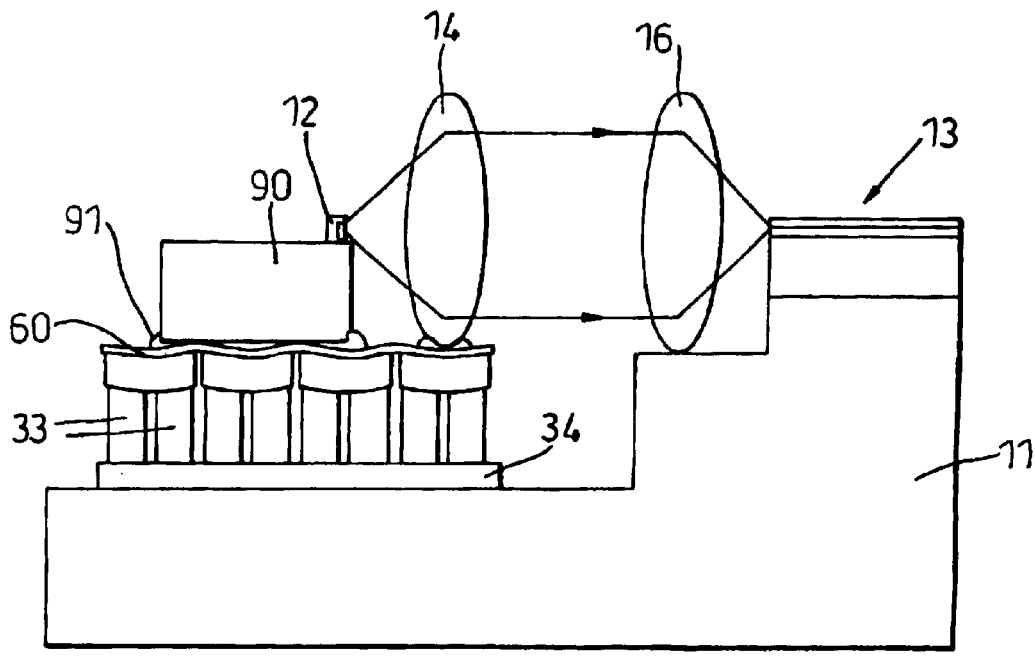
FIG. 9 is a schematic diagram of half an optical train mounted on a thermo-electric cooler.

This type of arrangement is fully scaleable. Multiple thermo-electric coolers can be arranged in series to support extended optical trains and without a risk of optical coupling loss. It is also possible for only part of an optical train to be supported by a thermo-electric cooler according to the present invention. This is illustrated in FIG. 9. In this case half an optical train comprising a laser carrier 90, a laser 12 and one lens 14 are mounted on a thermo-electric cooler whereas the rest of the optical train, comprising a lens 16 and a waveguide 13 are mounted directly on a package base 11. In this example, the laser carrier 90 is supported by more than one section of the thermo-electric cooler and rests on peaks of those sections as illustrated and as mentioned above.

Figure 10A:
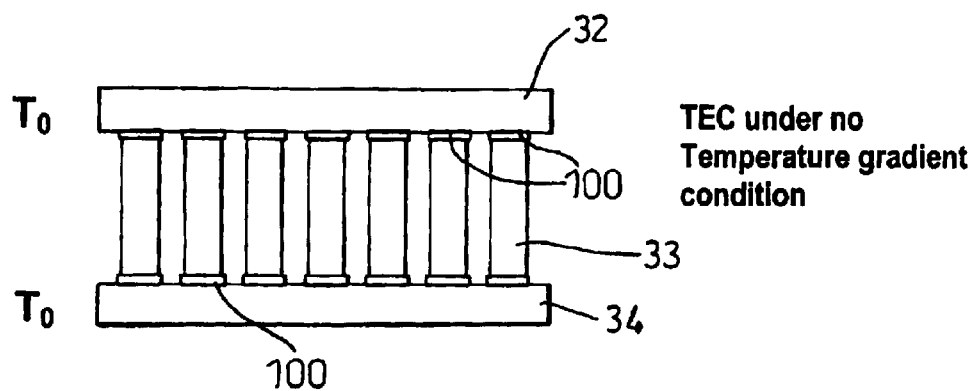
FIG. 10a is a schematic diagram of a thermo-electric cooler with solder pads according to the prior art and under no temperature gradient.
Figure 10B:
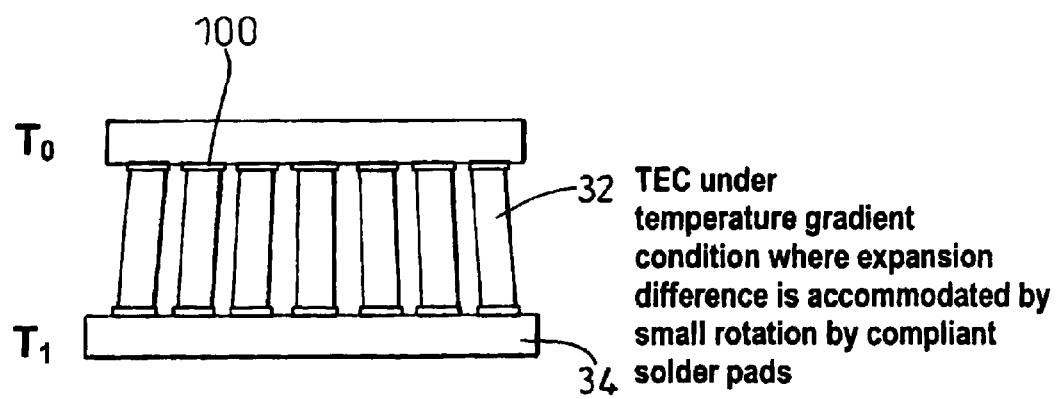
FIG. 10b is a schematic diagram of the thermo-electric cooler of FIG. 10b under a temperature gradient.

As mentioned above, a thermo-electric cooler comprises columns 33 which are connected to a top plate 32 and a bottom plate 34 using solder joints or pads 100 as illustrated in FIG. 10a. FIG. 10a shows the situation when there is no temperature difference between the top plate 32 and the bottom plate 34. In the case when there is a temperature difference the columns 33 may rotate slightly as illustrated in FIG. 10b because of the compliant solder pads 100. This possibility was taken into account in our modelling. We assumed the presence of a 20 μm thick solder layer at ether end of each of the thermo-electric cooler columns. The simulations still indicated that deformation of the top surface of a thermo-electric cooler occurs as described above and that the embodiments of the present invention can advantageously be used to increase neutral regions.

Any range or device value given herein may be extended or altered without losing the effect sought, as will be apparent to the skilled person for an understanding of the teachings herein.

What is claimed is:

1. A thermo-electric cooler for use in an optical assembly said thermo-electric cooler comprising:
    a surface arranged to provide support for at least part of an optical train in use, said surface being divided into a plurality of regions separated by gaps, the regions each having a neutral region having lower deformation with temperature variation, the support being provided substantially by the neutral regions.

2. A thermo-electric cooler as claimed in claim 1 further comprising a thermally conductive layer substantially covering said surface including the gaps.

3. A thermo-electric cooler as claimed in claim 2 wherein the thermally conductive layer is compliant.

4. A thermo-electric cooler as claimed in claim 2 wherein the thermally conductive layer comprises graphite sheet.

5. A thermo-electric cooler as claimed in claim 2 wherein the thermally conductive layer is arranged to protrude into each of the gaps.

6. A thermo-electric cooler as claimed in claim 1 wherein the surface is arranged to indirectly support at least part of the optical train.

7. A thermo-electric cooler as claimed in claim 1 wherein the gaps in said surface are air gaps.

8. A thermo-electric cooler as claimed in claim 1 wherein the regions in the surface are of substantially the same size and shape.

9. A thermo-electric cooler as claimed in claim 1 which comprises only one temperature monitor.

10. A thermo-electric cooler as claimed in claim 1 wherein the thermally conductive layer has a thermal conductivity of above about 600 W/mK.

11. An optical assembly comprising a thermo-electric cooler as claimed in claim 1.

12. A method of manufacturing at least part of an optical assembly comprising:
    (i) dividing a surface of a thermo-electric cooler into a plurality of regions of substantially the same size and shape, the regions having neutral regions of lower deformation with temperature variation; and
    (ii) supporting optical components over said neutral regions of the surface of the thermo-electric cooler.

13. A method as claimed in claim 12 which further comprises placing a thermally conductive layer over said surface to cover said regions; and wherein the optical components are supported over the thermally conductive layer.

14. A method as claimed in claim 13 wherein said optical components are supported directly on said thermally conductive layer.

15. A method as claimed in claim 12 wherein said optical components are positioned substantially over the centre of said regions.

16. A method of operating an optical assembly, having at least one optical component, the assembly comprising a thermo-electric cooler comprising:
    a surface arranged to provide support for at least one of the optical components, said surface being divided into a plurality of regions separated by gaps, the regions each having a neutral region having lower deformation with temperature variation, the support being provided substantially by the neutral regions, the method having the step of using the cooler to control the temperature of the assembly.

17. An optical assembly having one of more optical components and a thermo-electric cooler, said thermo-electric cooler comprising:
    a surface arranged to provide support for at least one of the optical components, said surface being divided into a plurality of regions separated by gaps, the regions each having a neutral region having lower deformation with temperature variation, the support being provided substantially by the neutral regions.

* * * * *